United States Patent
Wang

(10) Patent No.: US 9,711,672 B2
(45) Date of Patent: Jul. 18, 2017

(54) HEATING AND POWER GENERATING APPARATUS USING SOLAR ENERGY

(76) Inventor: Tzeng Chyuan Wang, Seoul (KR)

( * ) Notice: Subject to any disclaimer, the term of this patent is extended or adjusted under 35 U.S.C. 154(b) by 161 days.

(21) Appl. No.: 14/397,613

(22) PCT Filed: Apr. 30, 2012

(86) PCT No.: PCT/KR2012/003342
§ 371 (c)(1),
(2), (4) Date: Feb. 10, 2015

(87) PCT Pub. No.: WO2013/165032
PCT Pub. Date: Nov. 7, 2013

(65) Prior Publication Data
US 2015/0194558 A1  Jul. 9, 2015

(51) Int. Cl.
*H01M 10/46* (2006.01)
*H01L 31/0525* (2014.01)
*H02S 40/44* (2014.01)
*F24J 2/46* (2006.01)
*F24J 2/52* (2006.01)
(Continued)

(52) U.S. Cl.
CPC ........ *H01L 31/0525* (2013.01); *F24J 2/4623* (2013.01); *F24J 2/5266* (2013.01); *H01L 31/0547* (2014.12); *H02J 7/0042* (2013.01); *H02S 20/32* (2014.12); *H02S 30/20* (2014.12); *H02S 40/44* (2014.12); *F24H 2240/09* (2013.01); *F24J 2/045* (2013.01); *F24J 2/407* (2013.01); *Y02B 10/12* (2013.01);
(Continued)

(58) Field of Classification Search
CPC . H02J 7/0042; H02J 7/355; H02J 7/35; H01L 32/042

USPC ........ 320/101, 107, 114; 136/209, 244, 245, 136/292; 126/569, 576
See application file for complete search history.

(56) References Cited

U.S. PATENT DOCUMENTS

2009/0288705 A1* 11/2009 Hiwatashi ................ F24J 2/268
136/256
2010/0065104 A1* 3/2010 Baruh ................ B63B 15/0083
136/251
(Continued)

FOREIGN PATENT DOCUMENTS

JP  H10313130  11/1998
JP  3091001  1/2003
(Continued)

OTHER PUBLICATIONS

Olson, Ken "Solar Hot Water; A Primer," pp. 1-11, year 2001.*

*Primary Examiner* — Edward Tso
(74) *Attorney, Agent, or Firm* — IPLA P.A.; James E. Bame

(57) ABSTRACT

A heating and power generating apparatus comprises: a frame installed on the roof of a building and having a predetermined area; a plurality of power generating units arranged inside the frame to collect sunlight and generate electricity; and a hot water supply unit buried inside of the frame to absorb sunlight and perform heating and hot water supply. According to the present invention, hot water can be generated by sunlight in the winter to supply hot water and heat a house, and power can be generated by sunlight in the summer to supply power for cooling a room and thus conserve the electrical energy used in a cooler, thus promoting energy saving and environmental protection.

6 Claims, 3 Drawing Sheets

(51) Int. Cl.
  *H02S 30/20* (2014.01)
  *H02S 20/32* (2014.01)
  *H02J 7/00* (2006.01)
  *H01L 31/054* (2014.01)
  *F24J 2/04* (2006.01)
  *F24J 2/40* (2006.01)

(52) U.S. Cl.
  CPC ............... *Y02B 10/20* (2013.01); *Y02B 10/70* (2013.01); *Y02E 10/47* (2013.01); *Y02E 10/60* (2013.01)

(56) References Cited

U.S. PATENT DOCUMENTS

2011/0049992 A1* 3/2011 Sant'Anselmo ........ F03D 1/005
   307/64
2011/0277815 A1* 11/2011 Sankrithi ................... F24J 2/14
   136/246

FOREIGN PATENT DOCUMENTS

| KR | 20100048003 | 5/2010 |
| KR | 20100110116 | 10/2010 |

\* cited by examiner

HEATING AND POWER GENERATING APPARATUS USING SOLAR ENERGY

BACKGROUND

The present invention relates a heating and power generating apparatus using solar energy, and a heating and power generating apparatus using solar energy which is capable of performing a hot water supply, a heating operation and a small amount of electricity generation using a solar energy in the winter and generate electricity for cooling in the summer by converting sunlight into electricity for the sake of electricity generation, which are made possible by providing three kinds of devices which are installed on a roof or a wall of a house and make it possible to generate hot water, hot water and electricity and electricity in one frame.

In general, solar energy is most used as an alternative energy thanks to its pollution free characteristics and endless supply because heat and electricity may be generated using light. Electricity may be generated using solar cells, and the water heated using sunlight may be used for the sake of a heating system and may be also used as heated water for daily life. For this reason, a wide range of its researches and commercialization on solar energy are under way.

The most frequently used technology on the use of solar energy may be a sunlight-based boiler system and a charging device using solar cells.

The sunlight-based boiler system includes a sunlight collector installed on the roof, and a water heating pipe heated by the heat from the sunlight collector, a storing tank and a circulation pump.

Therefore, in the winter wherein heating operation and heated water are used a lot, the sunlight-based boiler system in general is used so as to save the consumption of electricity, so there is an advantage wherein energy can be saved and environment can be protected.

In the summer, since such heating operation and heated water are not used a lot, the sunlight-based boiler system is not actually used, so the space is unnecessarily occupied.

SUMMARY OF THE INVENTION

The present invention is made in an effort to improve the above-described technical problems. It is an object of the present invention to provide a heating and power generating apparatus using solar energy which makes it possible to perform a hot water supply and a heating operation by generating a small amount of electricity and heated water using sunlight in the winter and assisting electrical energy used for a heater in such a way that electricity is generated using sunlight in the summer for thereby supplying as cooling electricity, so the energy consumption may be saved while protecting environment.

To achieve the above objects, there is provided a heating and power generating apparatus using solar energy, comprising a frame which is installed at a roof and a wall surface of a building and has a predetermined area; a plurality of generators which are installed inside of the frame and are configured to collect sunlight and generate electricity; and a hot water supply unit which is buried inside of the frame and is configured to perform a heating operation and a hot water supply by absorbing sunlight.

The generator comprises a case; a sunlight collection belt which is accommodated inside of the case, wherein solar cells are mounted on an outer surface of the sunlight collection belt; a driving means which provides a driving force so as to unwind or wind the sunlight collection belt; a battery which stores the electricity generated by the solar cells; and a controller which controls the operation of the driving means.

The sunlight collection belt comprises a plate part to which the solar cells are attached; and a space part which is open for allowing the sunlight to transmit, wherein a strap part connected to the plate part is formed at both sides of the space part, and the plate part and the strap part are connected to the driving means, respectively.

The driving means comprises first and second shafts which are fixed at the ends of the plate part and the strap part of the sunlight collection belt; and first and second motors which wind or unwind the sunlight collection belt by rotating the first and second shafts.

The hot water supply unit comprises a small-sized water tank which is installed on a roof of a building and below the generator and is configured to store water; a water heating pipe which is formed in a U-shape and has at its one end an inlet and an outlet, wherein the inlet and the outlet are connected to the small-sized tank; and a large-sized tank which is connected through the pipe to the small-sized tank and stores the heated water.

The water heating pipe is disposed at the bottom of the sunlight collection belt of the case, wherein a heat absorption film is coated on an outer surface thereof.

The water heating pipe is engaged slanting downward, wherein the cold water inputted through the inlet is heated and is converted into heated water, and the heated water rises and circulates through the inlet to the small-sized tank.

The finishing panel having a good heat insulation and light collection performance is attached to the bottom of the frame, and the finishing panel comprises a body which has translucency; a heat insulation material filled inside of the body, and a water heating pipe; and a hollow part which is formed at an inner side of the body.

The generator comprises a case which is engaged to an installation space of the frame; a sunlight collection belt which is accommodated inside of the case, wherein solar cells are mounted on an outer surface of the sunlight collection belt; a driving means which generates a driving force so as to unwind or wind the sunlight collection belt; a battery which stores electricity generated by the solar cells; and a controller which controls the operations of the driving means.

The generator comprises a plurality of sunlight collection plates which are rotatably installed at an outer side of each of the plurality of the water heating pipes, wherein solar cells are mounted on an outer surface of each of the sunlight collection plates; a driving means which generates a driving force so as to selectively arrange the plurality of the sunlight collection plates at a predetermined position between the top and the bottom of the water heating pipe by rotating the plurality of the sunlight collection plates; a battery which stores the electricity generated by the solar cells; and a controller which controls the operations of the driving means.

The present invention makes it possible to generate a predetermined amount of electricity using sunlight at a house in the winter or perform a hot water supply and a heating operation by generating heated water, and in the summer, electricity may be generated using sunlight and may be supplied as an electricity for a cooling operation, so it is possible to assist the use of electric energy used at the cooler, thus saving the consumption of energy and protecting environment.

LEGENDS ON THE REFERENCE NUMBERS OF THE MAJOR COMPONENTS IN THE DRAWINGS

| | |
|---|---|
| 1: frame | 2: generator |
| 3: hot water supply unit | 4: rail |
| 5: finishing panel | 22: sunlight collection belt |
| 31: water heating pipe | P: plate |
| C: sunlight collection plate | |

DETAILED DESCRIPTION OF THE INVENTION

The preferred exemplary embodiments of the present invention will be described in detail with reference to the accompanying drawings.

First Embodiment

Figure 1:
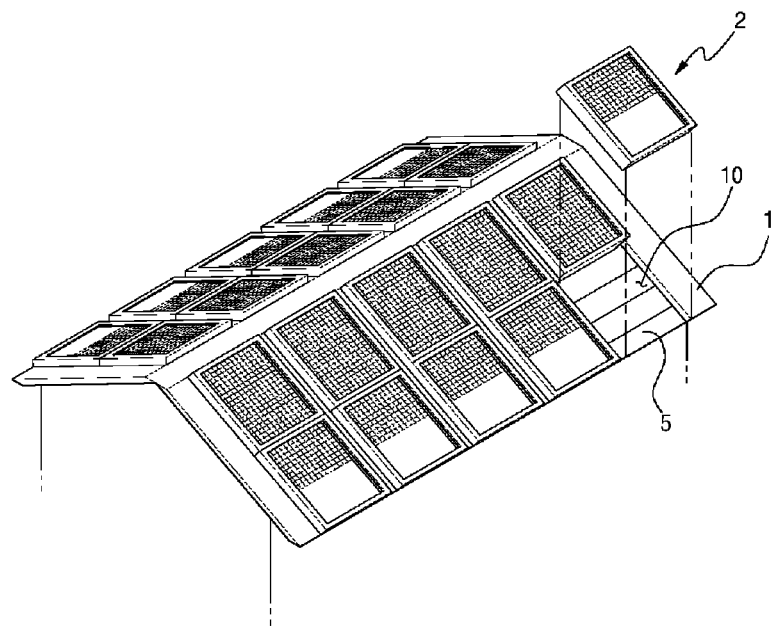
FIGS. 1 and 2 are views illustrating a configuration of a heating and power generating apparatus using solar energy according to the present invention.
Figure 2:
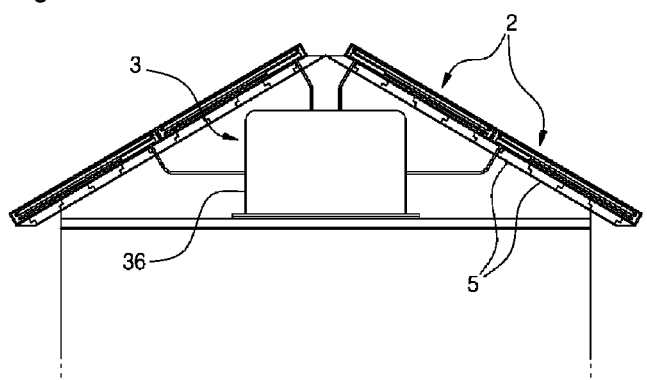
Figure 3:
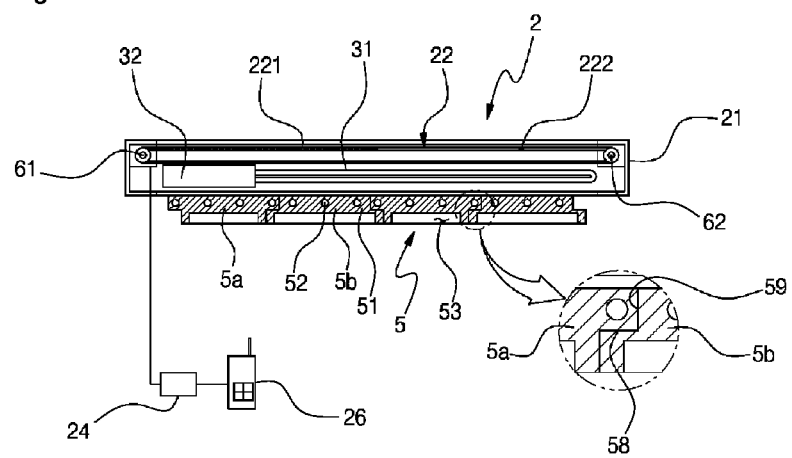
FIG. 3 is a cross sectional view illustrating a generator of a heating and power generating apparatus using solar energy according to a first exemplary embodiment of the present invention.
Figure 4:
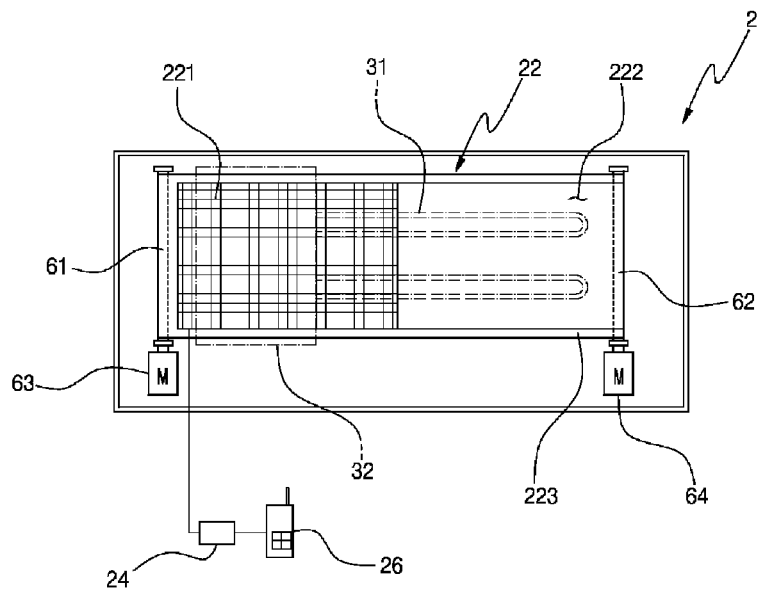
FIG. 4 is a plain view illustrating a generator for a heating and power generating apparatus using solar energy according to a first exemplary embodiment of the present invention.

FIGS. 1 and 2 are views illustrating a configuration of a heating and power generating apparatus using solar energy according to the present invention. FIG. 3 is a cross sectional view illustrating a generator of a heating and power generating apparatus using solar energy according to a first exemplary embodiment of the present invention. FIG. 4 is a plain view illustrating a generator for a heating and power generating apparatus using solar energy according to a first exemplary embodiment of the present invention.

Referring to FIGS. 1 to 4, the heating and power generating apparatus "A" using solar energy according to a first exemplary embodiment of the present invention comprises a frame 1 which is installed at a roof and a wall surface of a building and has a predetermined area; a plurality of generators 2 which are installed inside of the frame 1 and are configured to collect sunlight and generate electricity; and a hot water supply unit 3 which is buried inside of the frame 1 and is configured to perform a heating operation and a hot water supply by absorbing sunlight.

The frame 1 is installed over the entire area of the roof, and the frame 1 is preferably formed in a shape of a lattice like a go board. Since the frame 1 is formed in a lattice structure, a plurality of installation spaces 10 wherein the generators 2 are installed may be formed.

The frame 1 is formed in a rectangular shape in consideration of the shape of the roof which in general is rectangular, and each of the installation spaces 10 is formed in a rectangular shape.

The generator 2 in general is used in the summer wherein the use of electricity is a lot, but there is rarely the use for a heating operation or heated water.

Namely, the functions for the heating operation or the heated water are rarely used in the summer, so electricity is generated using the solar cells by mainly operating the generator 2.

The generator 2 is installed at each installation space 10 of the frame 1, and the number of the installations of the generator 2 is directly related to the amount of electricity generation, so it is preferred that a predetermined number of the generators 2 is installed.

The generator 2 according to an exemplary embodiment of the present invention comprises a case 21 which is engaged to an installation space of the frame 1; a sunlight collection belt 22 which is accommodated inside of the case 21, wherein solar cells are mounted on an outer surface of the sunlight collection belt 22; a driving means which generates a driving force so as to unwind or wind the sunlight collection belt 22; a battery 24 which stores electricity generated by the solar cells; and a controller 26 which controls the operations of the driving means.

The case 21 is formed as a whole in a rectangular shape and has a space whose interior is empty and includes a connection member for being connected to another case.

As an example of the connection member, a protrusion and a groove each having a predetermined length may be formed on an outer surface of the case 21 for the sake of an insertion and engagement to another case. The case may be connected through a connection pin to another case.

The apparatus may be prevented from being damaged during earthquake thanks to the insertion and engagement structure of the case 21.

The sunlight collection belt 22 includes a plate part 221 to which thin film-shaped solar cells are attached to form a predetermined area at its outer surface for thereby collecting sunlight, and a space part 222 having an opening through which sunlight passes, and at both sides of the space part 222, a strap part 223 connected to the plate part 221 is formed.

Since the sunlight collection belt 22 rotates in a normal direction or a reverse direction by means of the operation of a driving unit, the plate part 221 to which the solar cells are attached is unwound or wound. When the sunlight collection belt 22 is wound, sunlight may be directly scanned onto the hot water supply unit 3.

Referring to FIGS. 3 and 4, the driving unit according to an exemplary embodiment includes first and second shafts 61 and 62 which are fixed at the ends of the plate part 221 and the strap part 223 of the sunlight collection belt 22, and first and second motors 63 and 64 which are driven to wind or unwind the sunlight collection belt 22 by rotating in the normal or reverse direction the first and second shafts 61 and 62.

The above-described driving unit is described as one example and is not limited thereto, and it is obvious that such a structure may be modified into a variety of structures generating driving force to wind or unwind the sunlight collection belt 22.

The first and second motors 63 and 64 may be controlled to be turned on or off in such a way that a user in an indoor space operates a controller 26. It is preferred that a geared motor is adopted so as to accurately adjust the revolutions.

The present invention may be used only for the hot water supply in the winter.

So, when the sunlight collection belt 22 of the generator 2 is wound, the sunlight may be directly emitted through the space part 222 for thereby performing a heating operation and producing heated water.

The hot water supply unit 3 comprises a small-sized tank 32 which is installed on a roof of a building and below the generator 2 for storing water, a U-shaped water heating pipe 31 at one end of which an inlet and an outlet are formed and connected to the small-sized tank 32, and a large-sized tank 36 which is connected to the small-sized tank 32 for storing heated water.

The water heating pipe 31 is disposed at the bottom of the sunlight collection belt 22 of the case 21, and a heat absorption film of a black color is coated on the outer surface of the water heating pipe 31.

When the sunlight collection belt 22 is wound, the plate part 221 on which the solar cells are mounted is wound on the first shaft 61, and at the same time, the space part 222 is exposed, and the sunlight is inputted through the space part 222 for thereby directly heating the water heating pipe 31, so the water flowing through the water heating pipe 31 may be heated.

Preferably, the water heating pipe 31 is engaged slanting downwardly, and the water is circulated based on an overflow way.

Specifically, the cold water inputted through the inlet of the water heating pipe 31 is heated by radiant heat of the sunlight and is converted into heated water, and since the cold water is continuously inputted, the heated water overflows through the inlet and is inputted into the small-sized tank 32.

In addition, a water supply (not illustrated) is installed at a pipe which interconnects the small-sized tank 32 and the large-sized tank 36 so as to let the water circulate.

A roof is installed at the bottom of the frame 1 so as to prevent rain, snow or wind from directly entering the indoor space from the outside. The roof is made by connecting a plurality of finishing panels 5 which are capable of easily obtaining heat insulation and light input.

The finishing panel 5 includes a body 51 made from a transparent material to have translucency, a heat insulation material filled inside of the body 51, and a water heating pipe 52. A hollow part 53 is formed at an inner side of the body 51 for thereby doubling heat insulation effects and heat reserving effects.

The air of the hollow part 53 enables the state heated by the temperature of the indoor to continue, and the heat insulation effects may be enhanced by blocking the external low temperature air from directly contacting with the indoor air.

The water heating pipe 52 buried in the finishing panel 5 is arranged in one row or two rows and is connected to the water tank (not illustrated), and in case that the water heating pipe 52 is arranged in one row, the translucency may be enhanced along with good interior effects.

The body 51 has an engaging part formed at both ends thereof for thereby being connected to another finishing panel.

As an example of the engaging part, a shoulder 58 is formed at both sides of the top of the finishing panel 5 of one side, and the finishing panel 5 of the other side includes a groove 59 for thereby being engaged to both sides of the top of the body 51.

Therefore, the shoulder 58 of the finishing panel 5a of one side is inserted in the groove 59 of the finishing panel 5b of the other side, and an adhesive is applied on a portion connecting the shoulder 58 and the groove 59, so the shoulder 58 and the groove 59 are adhered for thereby obtaining a sealed engagement.

The installation and operation of the thusly constituted present invention will be described.

First, a plurality of the finishing panels 5 are connected so as to manufacture a roof.

Thereafter, the frame 1 is installed at the top of the finishing panel 5, and the generator 2 is installed in each installation space 10.

Namely, the case 21 of the generator 2 is inserted in the installation space 10 of the frame 1 and is secured using an engaging member such as a bolt.

At this time, a driving unit is installed inside of the case 21, and the sunlight collection belt 22 is connected for thereby being wound or unwound by means of the driving unit.

A plurality of the water heating pipes 31 are installed at the bottom of the sunlight collection belt 22, and the small-sized tank 32 is installed to communicate with the water heating pipe 31, and the small-sized tank 32 is connected through a pipe to the external large-sized tank 36, so the installation of the present invention is finished.

Since the apparatus of the present invention is mainly used for the purpose of electricity generation, the sunlight collection belt 22 is unwound at the indoor by handling the controller 26 to expose the solar cells for thereby collecting sunlight and generating electricity.

The unwinding ratio of the sunlight collection belt 22 mat be set at 30%, 60% and 90%, and is not limited thereto.

The unwinding operations of the sunlight collection belt 22 may be performed by a manual method wherein the user directly handles or an automated method wherein the unwinding operations may be automatically performed based on a control of the program which operates in relation to the sun detection sensor.

The electricity generated by the generator 2 may be used as an electric power for the indoor cooler, thus saving the consumption amount of electricity.

Second Embodiment

Figure 5:
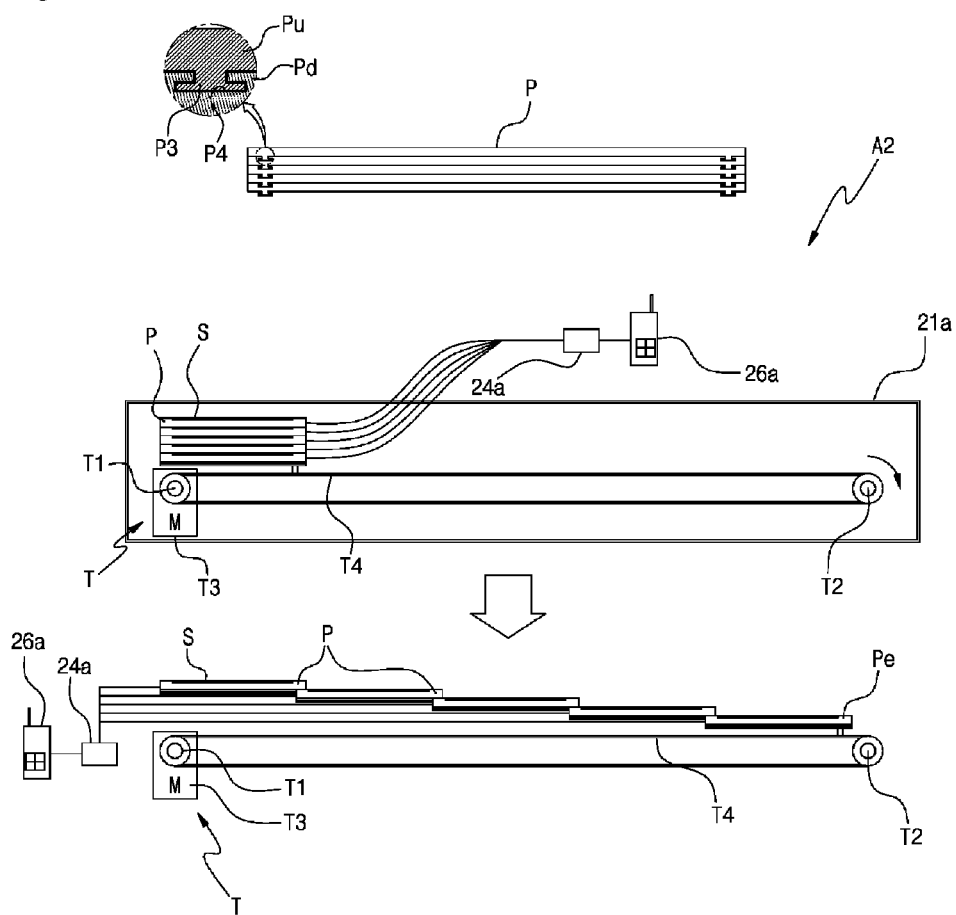
FIG. 5 is a view illustrating a generator according to a second exemplary embodiment of the present invention.

FIG. 5 is a view illustrating a generator according to a second exemplary embodiment of the present invention.

Referring to FIG. 5, the generator according to a second exemplary embodiment "A2" of the present invention includes a case 21a engaged to an installation space of the frame 1, a plurality of plates "P" which are accommodated like being stacked inside of the case 21a and are folded based on sliding and have solar cells "S" on their outer surfaces, a battery 24a which stores electricity generated by the solar cells "S", a driving unit "T" which drives the folding operations of the plurality of the plates "P", and a controller 26a which controls the operations of the driving unit "T".

The plurality of the plates "P" are made from a solid or smooth plate material and have solar cells "S" on their outer surfaces. Each plate "P" is connected to each other and may be folded based on sliding.

A guide protrusion "P3" is formed at the lower surface of an upper plate "Pu", and a rail "P4" having a predetermined length into which the guide protrusion "P3" is inserted is formed on the upper surface of the lower plate "Pd", so the folding may be performed while the lower plate "Pd" moves forward or backward.

Preferably, the guide protrusion "P3" and the rail "P4" have the upside down T-shaped cross section so that the upper plate "Pu" and the lower plate "Pd" are not separated from each other and are engaged with each other.

The driving unit "T" serves to generate driving force for unfolding by sequentially ejecting one by one the plurality of the plates "P" or folding the plates again in order to store the same.

As an example of the driving unit "T", the driving unit "T" includes a chain "T4" having a predetermined length to which a bracket formed at the lower most plate "Pe" among the plurality of the plates "P" is connected, driving and driven sprockets "T1" and "T2" to which the chain "T4" is engaged and which are separated by a predetermined interval, and a motor "T3" which is connected to the driving sprocket "T1".

The above description is one example and it is obvious that in addition to that, the present invention may be implemented in various forms.

Third Embodiment

Figure 6:
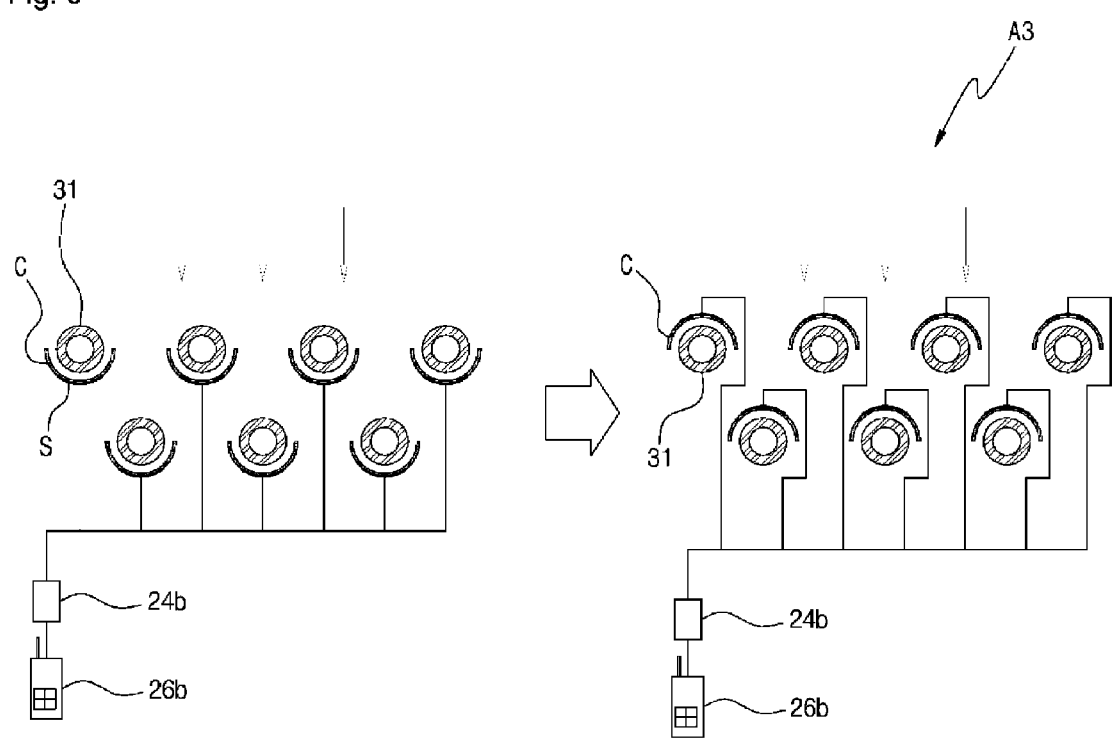
FIG. 6 is a view illustrating a generator according to a third exemplary embodiment of the present invention.

FIG. 6 is a view illustrating a generator according to a third exemplary embodiment of the present invention.

Referring to FIG. 6, the generator according to a third exemplary embodiment "A3" of the present invention includes a plurality of sunlight collection plates "C" which are rotatably installed at an outer side of each of the plurality of the water heating pipes 31, wherein the solar cells "S" are mounted on the outer surfaces thereof, a driving unit which drives the plurality of the sunlight collection plates "C" so as to selectively arrange the sunlight collection plates "C" at a predetermined position between the top and the bottom of the water heating pipe 31 by rotating the plurality of the sunlight collection plates "C", a battery 24b which stores the electricity generated by the solar cells "S", and a controller 26b which controls the operations of the driving unit.

The plurality of the sunlight collection plates "C" are formed in a shape of arc and are made of a metallic or plastic material, and the solar cells are mounted on the outer surface thereof, and the driving unit is connected to one end of the sunlight collection plate "C".

The driving unit serves to concurrently or separately rotate the plurality of the sunlight collection plates and enables the plurality of the sunlight collection plates "C" to be selectively positioned at the top or the bottom of the water heating pipe 31, so it can be switched for the use of heating operation, hot water supply or electricity generation.

As an example, the driving unit includes a plurality of rotary shafts to which a plurality of sunlight collection plates "C" are attached, a sprocket formed at one end of each of the plurality of the rotary shafts, a connection member like a chain for connecting the sprocket, and a motor which rotates the connection member.

Referring to FIG. 6A, when the sunlight collection plate "C" is positioned below the water heating plate 31 in the winter, the sunlight is scanned onto the water heating pipe 31, thus heating inside water, so the heating operation and hot water supply become possible.

Referring to FIG. 6B, the sunlight collection plate "C" is positioned on the tip of the water heating pipe 31 in the summer for hereby generating electricity using the sunlight.

As the present invention may be embodied in several forms without departing from the spirit or essential characteristics thereof, it should also be understood that the above-described examples are not limited by any of the details of the foregoing description, unless otherwise specified, but rather should be construed broadly within its spirit and scope as defined in the appended claims, and therefore all changes and modifications that fall within the meets and bounds of the claims, or equivalences of such meets and bounds are therefore intended to be embraced by the appended claims.

The heating and power generating apparatus using solar energy according to the present invention is capable of performing a hot water supply, a heating operation and a small amount of electricity generation using a solar energy in the winter and generate electricity for cooling in the summer by converting sunlight into electricity for the sake of electricity generation, which are made possible by providing three kinds of devices which are installed on a roof or a wall of a house and make it possible to generate hot water, hot water and electricity and electricity in one frame.

The invention claimed is:

1. A heating and power generating apparatus using solar energy, comprising:
    a frame which is installed at a roof and a wall surface of a building and has a predetermined area;
    a plurality of generators which are installed inside of the frame and are configured to collect sunlight and generate electricity; and
    a hot water supply unit which is buried inside of the frame and is configured to perform a heating operation and a hot water supply by absorbing sunlight,
    wherein the plurality of generators comprise:
    a case which is engaged to an installation space of the frame;
    a sunlight collection belt which is accommodated inside of the case, wherein solar cells are mounted on an outer surface of the sunlight collection belt;
    a driving means which generates a driving force so as to unwind or wind the sunlight collection belt, so as to selecting the plurality of generators or the hot water supply unit, so that the apparatus is switched for the use of heating operation, hot water supply or electricity generation;
    a battery which stores electricity generated by the solar cells; and
    a controller which controls the operations of the driving means.

2. The apparatus of claim 1, wherein the sunlight collection belt comprises:
    a plate part to which the solar cells are attached; and
    a space part which is open for allowing the sunlight to transmit,
    wherein a strap part connected to the plate part is formed at both sides of the space part, and the plate part and the strap part are connected to the driving means, respectively.

3. The apparatus of claim 1, wherein the driving means comprises:
    first and second shafts which are fixed at the ends of the plate part and the strap part of the sunlight collection belt; and
    first and second motors which wind or unwind the sunlight collection belt by rotating the first and second shafts.

4. The apparatus of claim 1, wherein the hot water supply unit comprises:
    a small-sized water tank which is installed on a roof of a building and below the generator and is configured to store water;
    a water heating pipe which is connected to the small-sized tank and is disposed below the sunlight collection belt, wherein a heat absorption film is formed on an outer surface of the water heating pipe.

5. The apparatus of claim 1, wherein the roof is made of a plurality of finishing panels which are attached to the bottom of the frame, and the finishing panel comprises:
    a body which has translucency;

a heat insulation material filled inside of the body, and a water heating pipe; and a hollow part which is formed at the bottom of an inner side of the body and has an air layer.

6. A heating and power generating apparatus using solar energy, comprising:

a frame which is installed at a roof and a wall surface of a building and has a predetermined area;

a plurality of generators which are installed inside of the frame and are configured to collect sunlight and generate electricity; and a hot water supply unit which is buried inside of the frame and is configured to perform a heating operation and a hot water supply by absorbing sunlight, wherein the plurality of generators comprise:

a plurality of sunlight collection plates which are rotatably installed at an outer side of each of the plurality of the water heating pipes, wherein solar cells are mounted on an outer surface of each of the sunlight collection plates;

a driving means which generates a driving force so as to selectively arrange the plurality of the sunlight collection plates at a predetermined position between the top and the bottom of the water heating pipe by rotating the plurality of the sunlight collection plates, so as to selecting the plurality of generators or the hot water supply unit, so that the apparatus be switched for the use of heating operation, hot water supply or electricity generation;

a battery which stores the electricity generated by the solar cells; and a controller which controls the operations of the driving means.

\* \* \* \* \*